(12) United States Patent
Pan

(10) Patent No.: US 9,780,654 B2
(45) Date of Patent: Oct. 3, 2017

(54) ANALOG ASSISTED DIGITAL SWITCH REGULATOR

(71) Applicant: MICRON TECHNOLOGY, INC., Boise, ID (US)

(72) Inventor: Feng Pan, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 131 days.

(21) Appl. No.: 14/657,545

(22) Filed: Mar. 13, 2015

(65) Prior Publication Data
US 2016/0268897 A1    Sep. 15, 2016

(51) Int. Cl.
| | | |
|---|---|---|
| *H02M 3/158* | (2006.01) | |
| *G11C 5/14* | (2006.01) | |
| *G11C 16/30* | (2006.01) | |
| *H02M 1/00* | (2006.01) | |

(52) U.S. Cl.
CPC ............ *H02M 3/158* (2013.01); *G11C 5/147* (2013.01); *G11C 16/30* (2013.01); *H02M 2001/0045* (2013.01)

(58) Field of Classification Search
CPC ...... H02M 3/145; H02M 3/155; H02M 3/156; H02M 3/157; H02M 3/158; H02M 3/1584; H02M 3/1588; H02M 2001/0032; H02M 2001/0035; H02M 2001/0025; H02M 2003/1566; H02M 2001/0029; H02M 2001/0045; G05F 1/10; G05F 1/575; G05F 1/468; G05F 1/46; G05F 1/461; G05F 1/462; G05F 1/466; G05F 1/467; G05F 1/56; G05F 1/562; G05F 1/563; G05F 1/565; G05F 1/59; G05F 1/569; G05F 3/02; G05F 3/08; G05F 3/16; G05F 3/22; G05F 3/24; G05F 3/222; G05F 3/242; G11C 5/00; G11C 5/14; G11C 5/147; G11C 16/00; G11C 16/02; G11C 16/06; G11C 16/30
USPC ........ 323/222–226, 234, 266, 268–276, 280, 323/282–285, 288, 311, 312, 351, 908; 327/538, 540, 541; 365/226–229, 189.09
See application file for complete search history.

(56) References Cited

U.S. PATENT DOCUMENTS

| | | | | |
|---|---|---|---|---|
| 6,040,686 | A | * 3/2000 | Schenkel | H02M 3/156 323/282 |
| 2006/0186865 | A1 | * 8/2006 | Placa | G05F 1/56 323/273 |
| 2012/0153909 | A1 | * 6/2012 | Bucossi | H02M 1/15 323/271 |
| 2013/0234684 | A1 | * 9/2013 | Chang | G05F 1/468 323/281 |
| 2013/0241289 | A1 | * 9/2013 | Ogawa | H02J 1/00 307/52 |

* cited by examiner

*Primary Examiner* — Timothy J Dole
*Assistant Examiner* — Carlos Rivera-Perez
(74) *Attorney, Agent, or Firm* — Dicke, Billig & Czaja, PLLC

(57) ABSTRACT

A device includes a digital switch regulator to supply an output voltage and a first current to a load based on a reference voltage. The device also includes an analog circuit to supply a second current to the load in addition to the first current based on a duty cycle of the digital switch regulator.

19 Claims, 9 Drawing Sheets

US 9,780,654 B2

ANALOG ASSISTED DIGITAL SWITCH REGULATOR

TECHNICAL FIELD

The present disclosure relates generally to voltage regulation, in particular, in one or more embodiments, the present disclosure relates to an analog assisted digital switch regulator.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

The use of digital switch regulators for voltage regulation provides the benefit of higher bandwidth compared to other forms of voltage regulation. The switching power of digital switch regulators, however, increases as a function of the load current.

For the reasons stated above, and for other reasons stated below which will become apparent to those skilled in the art upon reading and understanding the present specification, there is a need in the art for alternative methods for digital switch regulation, and apparatus to perform such methods.

DETAILED DESCRIPTION

Figure 1A:
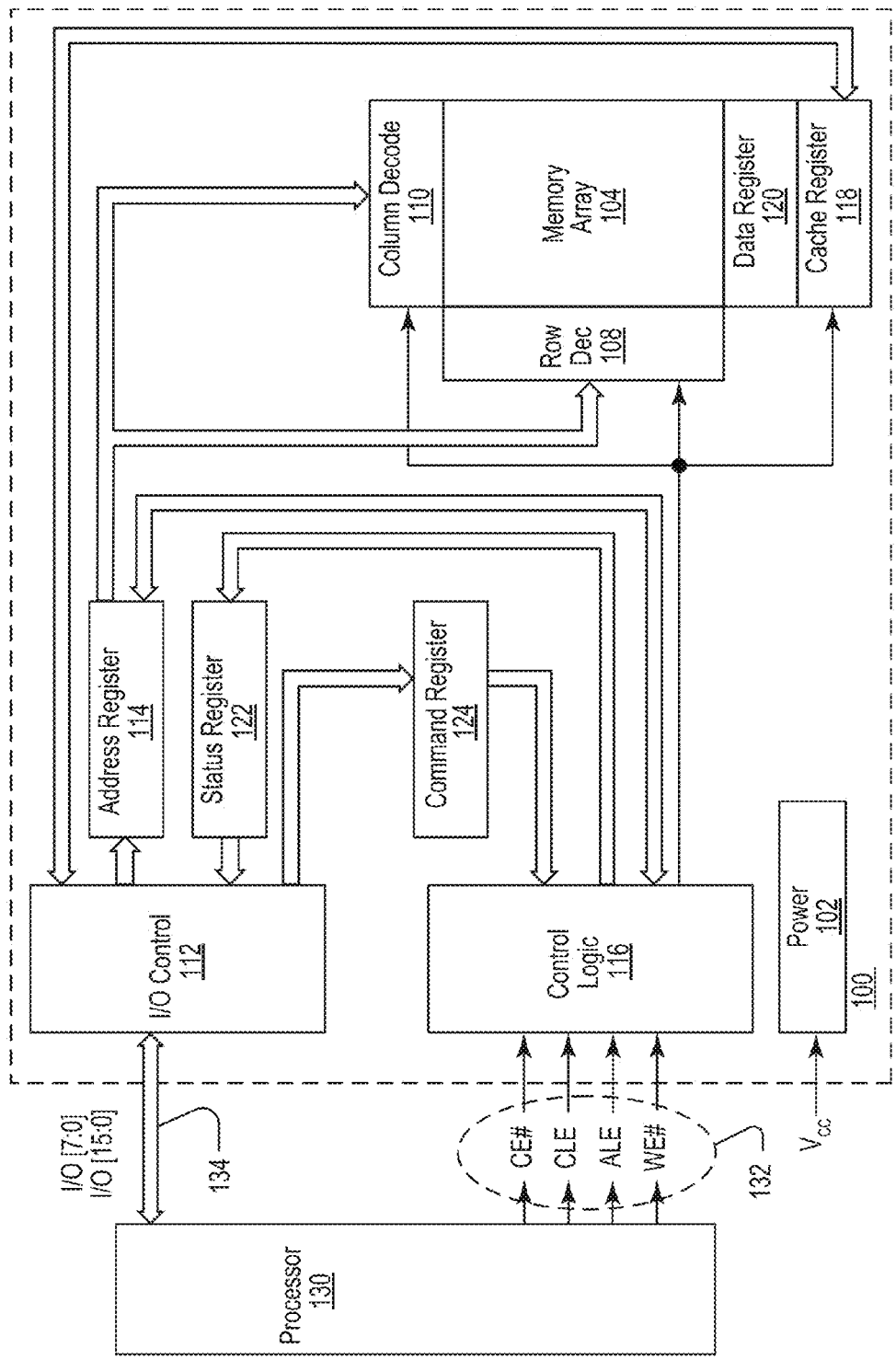
FIG. 1A is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Digital switch regulators provide the benefit of higher bandwidth compared to other forms of voltage regulation. The switching power of digital switch regulators, however, increases as a function of the load current. Accordingly, this disclosure describes embodiments for reducing the switching power of digital switch regulators. The switching power of a digital switch regulator is reduced by adding an analog portion to the digital portion of the switch regulator as will be described below with reference to the following figures.

FIG. 1A is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes power circuitry 102. Power circuitry 102 may include an analog assisted digital switch regulator that receives a supply voltage, e.g., $V_{CC}$, and provides a regulated voltage for powering memory device 100. The analog assisted digital switch regulator uses less power than a digital switch regulator without an analog portion. In one example, the supply voltage $V_{CC}$ is between 2.7 volts and 3.6 volts or another suitable voltage depending on the application.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1A) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1A has been simplified. It should be recognized that the functionality of the various block components described with reference to FIG. 1A may not necessarily be segregated to distinct components or component portions of an integrated circuit device. For example, a single component or component portion of an integrated circuit device could be adapted to perform the functionality of more than one block component of FIG. 1A. Alternatively, one or more components or component portions of an integrated circuit device could be combined to perform the functionality of a single block component of FIG. 1A.

Additionally, while specific I/O pins are described in accordance with popular conventions for receipt and output of the various signals, it is noted that other combinations or numbers of I/O pins may be used in the various embodiments.

Figure 1B:
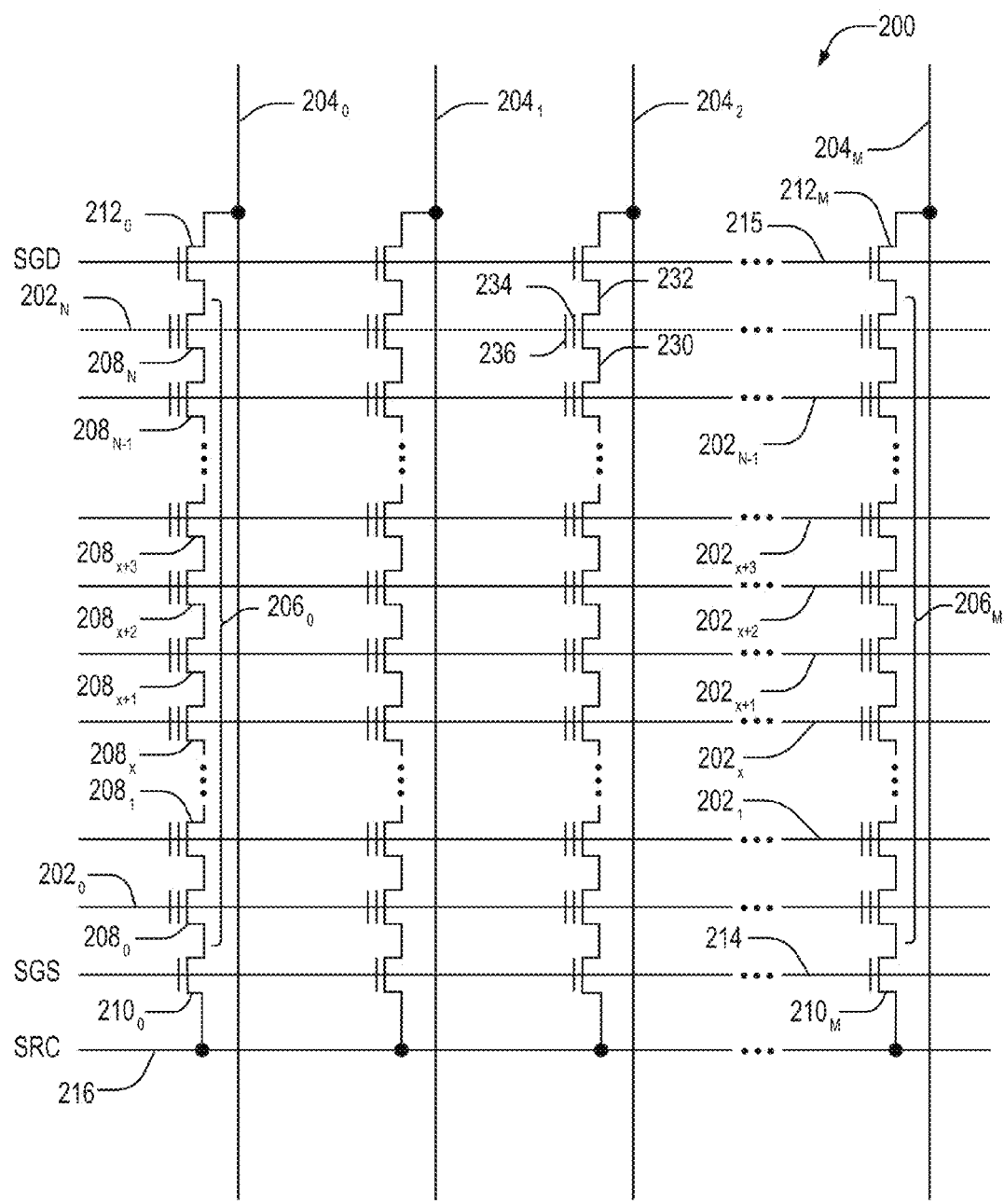
FIG. 1B is a schematic of a portion of an array of memory cells as could be used in a memory device of the type described with reference to FIG. 1A.

FIG. 1B is a schematic of a NAND memory array 200, e.g., as a portion of array of memory cells 104. Memory array 200 includes access lines, such as word lines $202_0$ to $202_N$, and data lines, such as bit lines $204_0$ to $204_M$. The word lines 202 may be coupled to global access lines (e.g., global word lines), not shown in FIG. 1B, in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 1B might be a quasi-two-dimensional memory array and might have a generally planar structure, e.g., where the common source 216, strings 206 and bit lines 204 extend in substantially parallel planes. Alternatively, the memory array in FIG. 1B might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 1B. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$ $204_5$ are not expressly depicted in FIG. 1B, it is apparent from the figure that the bit lines 204 of the array of memory cells 200 may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Although the example of FIG. 1B is discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 2:
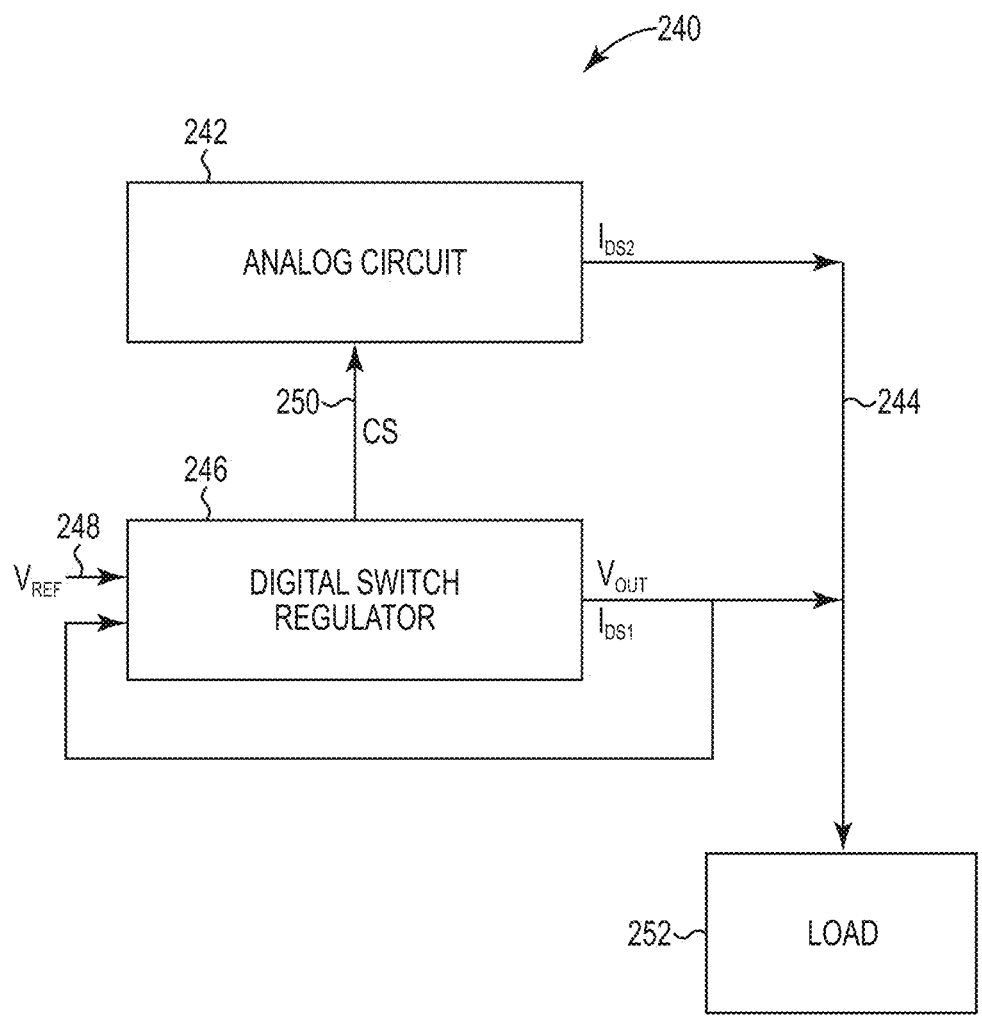
FIG. 2 is a block diagram illustrating one embodiment of an analog assisted digital switch regulator.

FIG. 2 is a block diagram illustrating one embodiment of an analog assisted digital switch regulator 240. Analog assisted digital switch regulator 240 includes an analog portion, i.e., analog circuit 242, and a digital portion, i.e., digital switch regulator 246. Digital switch regulator 246 is electrically coupled to analog circuit 242 through a control signal (CS) signal path 250. The output of digital switch regulator 246 and the output of analog circuit 242 are electrically coupled to a load 252 through a signal path 244. In one example, load 252 is circuitry within memory device 100 previously described and illustrated with reference to FIG. 1A. Load 252 may be a constant load (i.e., draw a constant current) or a variable load (i.e., draw a variable current).

Digital switch regulator 246 receives a reference voltage ($V_{REF}$) on signal path 248 and provides a regulated output voltage ($V_{OUT}$) on signal path 244 based on the reference voltage and a feedback signal indicating the output voltage. Digital switch regulator 246 also provides a control signal (CS) to analog circuit 242 based on the duty cycle (i.e., switching frequency) of digital switch regulator 246. Digital switch regular 246 provides a first portion of the output current supplied to load 252 as indicated by first current ($I_{DS1}$) on signal path 244. Analog circuit 242 provides a second portion of the output current supplied to load 252 as indicated by second current ($I_{DS2}$) on signal path 244. In one example, the bandwidth of analog circuit 242 is at least one decade lower than the bandwidth of digital switch regulator 246 to ensure stability of analog assisted digital switch regulator 240.

Analog circuit 242 is controlled by the switching frequency of digital switch regulator 246 as indicated by the control signal on signal path 250. As the switching frequency and on duty of digital switch regulator 246 increases, analog circuit 242 supplies a greater portion of the current drawn by load 252, thereby reducing the portion of the current drawn by load 252 from digital switch regulator 246. In this way, the switching power of analog assisted digital switch regulator 240 is reduced compared to a digital switch regulator 246 without an analog circuit 242.

Figure 3:
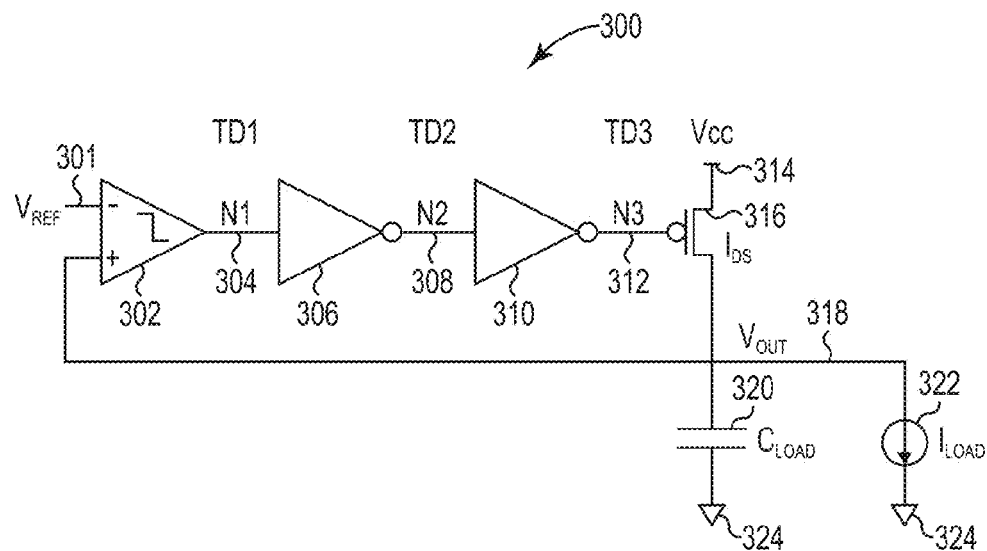
FIG. 3 is a schematic diagram illustrating one embodiment of a digital switch regulator.

FIG. 3 is a schematic diagram illustrating one embodiment of a digital switch regulator 300. Digital switch regulator 300 includes a comparator 302, a first inverter 306, a second inverter 310, and a transistor 316. First inverter 306 and second inverter 310 provide a buffer. The inverting input of comparator 302 receives a reference voltage ($V_{REF}$) on signal path 301. The non-inverting input of comparator 302 receives a feedback signal indicating the output voltage ($V_{OUT}$) on signal path 318. The output of comparator 302 is electrically coupled to the input of first inverter 306 through N1 signal path 304. The output of first inverter 306 is electrically coupled to the input of second inverter 310 through N2 signal path 308. The output of second inverter 310 is electrically coupled to the gate of transistor 316 through N3 signal path 312. In one example, transistor 316 is a p-channel field-effect transistor (pFET). The source-drain path of transistor 316 is electrically coupled between a supply voltage ($V_{CC}$) 314 and $V_{OUT}$ signal path 318. $V_{OUT}$ signal path 318 is electrically coupled to one side of a load represented by a capacitor ($C_{LOAD}$) 320 and a load current ($I_{LOAD}$) 322. The other side of the load is electrically coupled to a common or ground 324. In one example, $C_{LOAD}$ 320 is 1 nF or another suitable value and $I_{LOAD}$ is between 100 µA and 50 mA or another suitable value depending on the application.

In operation, in response to the output voltage $V_{OUT}$ being greater than the reference voltage $V_{REF}$, comparator 302 output a logic high signal on N1 signal path 304. The logic high signal on N1 signal path 304 is buffered by first inverter 306 and second inverter 310 to provide a logic high signal on N3 signal path 312. In response to the logic high signal on N3 signal path 312, transistor 316 turns off and does not supply current to the load. In response to the output voltage $V_{OUT}$ being less than the reference voltage $V_{REF}$, comparator 302 outputs a logic low signal on N1 signal path 304. The logic low signal on N1 signal path 304 is buffered by first inverter 306 and second inverter 310 to provide a logic low signal on N3 signal path 312. In response to the logic low signal on N3 signal path 312, transistor 316 turns on to supply a current ($I_{DS}$) to the load.

The following is a mathematical analysis for digital switch regulator 300. The equivalent loop delay $T_{loop}$ of digital switch regulator 300 is given by:

$$T_{loop} = td1 + td2 + td3$$

where: td1 is dependent upon the slew rate or linear settling time of comparator 302;

td2 is the digital gate delay of inverter 306 and inverter 310; and td3 is the delay from node N3 to $V_{OUT}$.

For a fixed load current $I_{LOAD}$, the pulse width $T_{total}$ of the switching frequency of digital switch regulator 300 is given by:

$$T_{total} = T_{on} + T_{off}$$

where: $T_{on}$ is the pulse on time; and
$T_{off}$ is the pulse off time.

The current $I_{DS}$ supplied by digital switch regulator 300 is given by:

$$\int_0^{T_{on}} I_{DS} \partial t = I_{load} T_{total}$$

The $T_{on}$ and $T_{off}$ times can be simplified to provide:

$$T_{on} = \frac{I_{load}}{I_{DS}} T_{total} = \frac{I_{load}}{I_{DS}}(T_{on} + T_{off}) => T_{on} = \frac{I_{load}}{I_{DS} - I_{load}} T_{off}$$

$$T_{off} = \frac{(I_{DS} - I_{load})T_{loop}}{I_{load}}$$

The switching power of digital switch regulator 300 is given by:

$$\text{Switching Power} = CV_{CC}^2 f$$

$$= CV_{CC}^2 \frac{1}{T_{on} + T_{off}}$$

$$= CV_{CC}^2 \frac{1}{\left(\frac{I_{load}}{I_{DS} - I_{load}} + 1\right) T_{off}}$$

$$= CV_{CC}^2 \frac{1}{\left(\frac{I_{load}}{I_{DS} - I_{load}} + 1\right) \frac{(I_{DS} - I_{load})T_{loop}}{I_{load}}}$$

$$= CV_{CC}^2 \frac{I_{load}}{I_{DS} T_{loop}}$$

where: C is the total capacitance of comparator 302, inverters 306 and 310, and transistor 316;
$V_{CC}$ is the supply voltage; and
$f$ is the switching frequency of digital switch regulator 300.

Based on the above equation, the switching power of digital switch regulator 300 may be reduced by reducing the load current $I_{load}$.

The overshoot $V_{overshoot}$ for when digital switch regulator 300 is turned on and the undershoot $V_{undershoot}$ for when digital switch regulator 300 is turned off are given by:

$$V_{overshoot} = \frac{(I_{DS} - I_{load})}{C_{load}} T_{on}$$

$$V_{undershoot} = \frac{I_{load} T_{loop}}{C_{load}}$$

Figure 4:
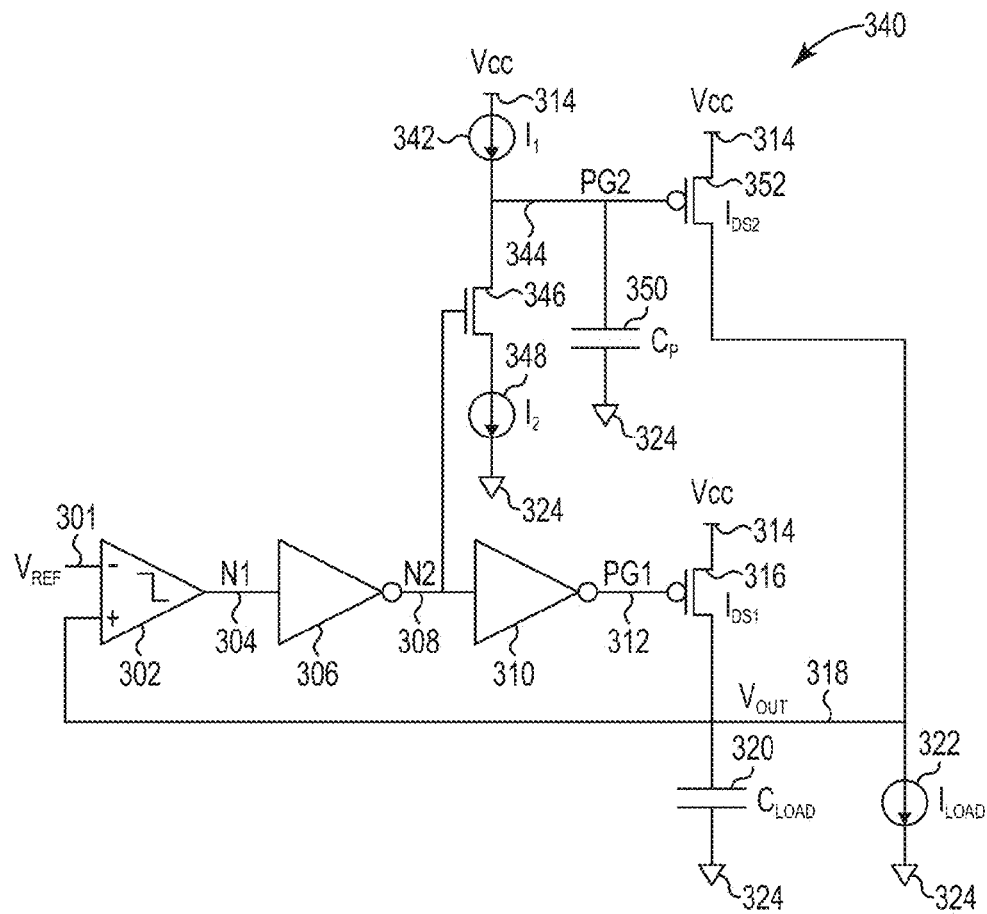
FIG. 4 is a schematic diagram illustrating one embodiment of an analog assisted digital switch regulator.

FIG. 4 is a schematic diagram illustrating one embodiment of an analog assisted digital switch regulator 340. Analog assisted digital switch regulator 340 includes a digital portion and an analog portion. The digital portion includes a digital switch regulator as previously described and illustrated with reference to FIG. 3 with the exception that signal path 312 is labeled as PG1 and the current supplied by the digital portion is labeled as $I_{DS1}$ in FIG. 4.

The analog portion includes a first current source ($I_1$) 342, a first transistor 346, a second current source ($I_2$) 348, a capacitor ($C_P$) 350, and a second transistor 352. In one example, first transistor 346 is an n-channel FET (nFET) and second transistor 352 is a pFET. One side of first current source 342 is electrically coupled to supply voltage 314. The other side of first current source 342 is electrically coupled to one side of the source-drain path of first transistor 346, one side of capacitor 350, and the gate of transistor 352 through PG2 signal path 344. The gate of first transistor 346 is electrically coupled to the output of inverter 306 through N2 signal path 308. The other side of the source-drain path of first transistor 346 is electrically coupled to one side of second current source 348. The other side of second current source 348 and the other side of capacitor 350 are electrically coupled to common or ground 324. The source-drain path of second transistor 352 is electrically coupled between supply voltage 314 and $V_{OUT}$ signal path 318. The various nodes of supply voltage 314 may supply the same voltage or different voltages. The second current source 348 is greater than the first current source 342. In one example, $I_1$ is 10 µA, $I_2$ is 20 µA, and $C_P$ is 1 pF or other suitable values depending on the application.

The digital portion of analog assisted digital switch regulator 340 operates similarly to digital switch regulator 300 previously described and illustrated with reference to FIG. 3. In operation of the analog portion, in response to the output voltage $V_{OUT}$ being greater than the reference voltage $V_{REF}$, comparator 302 output a logic high signal on N1 signal path 304. The logic high signal on N1 signal path 304 is inverted by first inverter 306 to provide a logic low signal on N2 signal path 308. In response to the logic low signal on N2 signal path 308, first transistor 346 turns off such that first current source 342 charges capacitor 350. The charging of capacitor 350 reduces the current conduction of second transistor 352 or completely turns off second transistor 352 such that second transistor 352 does not supply current to the load.

In response to the output voltage $V_{OUT}$ being less than the reference voltage $V_{REF}$, comparator 302 outputs a logic low signal on N1 signal path 304. The logic low signal on N1 signal path 304 is inverted by first inverter 306 to provide a logic high signal on N2 signal path 308. In response to the logic high signal on N2 signal path 308, first transistor 346 turns on such that second current source 348 discharges capacitor 350. The discharging of capacitor 350 increases the current conduction of second transistor 352 to supply a current ($I_{DS2}$) to the load.

The following is a mathematical analysis for analog assisted digital switch regulator 340. The current $I_{DS2}$ is proportional to:

$$I_{DS2} \propto (V_{cc} - V_{pg2}) \text{ or } (V_{cc} - V_{pg2})^2$$

where: $V_{pg2}$ is the voltage on PG2 signal path 344.
The $\Delta V_{pg2}$ is given by:

$$\Delta V_{pg2} = \int_0^T (I_1 - I_2) \frac{1}{C_P} \partial t$$

where: $I_1$ is the current from first current source 342;
$I_2$ is the current from second current source 348; and
$C_P$ is the capacitance of capacitor 350.

The slew rate is given by:

$$\text{Slew Rate} = \frac{I_1}{Cp} \text{ or } \frac{I_2}{Cp}$$

If the digital portion supplies the current to meet the load:

$$T_{total} = T_{on} + T_{off}$$

$$\int_0^{Ton} I_{DS1} \partial t = I_{load} T_{total}$$

If the analog portion also supplies some current to meet the load in addition to the digital portion:

$$T_{total2} = T_{on2} + T_{off2}$$

$$\int_0^{Ton2} I_{DS1} \partial t + I_{DS2} T_{total2} = I_{load} T_{total2}$$

$$\int_0^{Ton2} I_{DS1} \partial t = (I_{load} - I_{DS2}) T_{total2}$$

With reduced load on the digital portion, the power consumption of the analog assisted digital switch regulator is reduced by $I_{DS2}/I_{load}$. If for example 80% of $I_{load}$ is taken over by DC or low frequency current of $I_{DS2}$, switching power is reduced by 80%, with added power from $I_1$. The switching power for analog assisted digital switch regulator 340 is given by:

$$\text{Switching Power} = CV_{CC}^2 \frac{I_{load\_eq}}{I_{DS1} T_{loop}}$$

$$I_{load\_eq} = I_{load} - I_{DS2}$$

Based on the above equations, the switching power of analog assisted digital switch regulator 340 may be reduced compared to digital switch regulator 300 by reducing the current supplied to the load by the digital portion by $I_{DS2}$, which is supplied by the analog portion.

Figure 5:
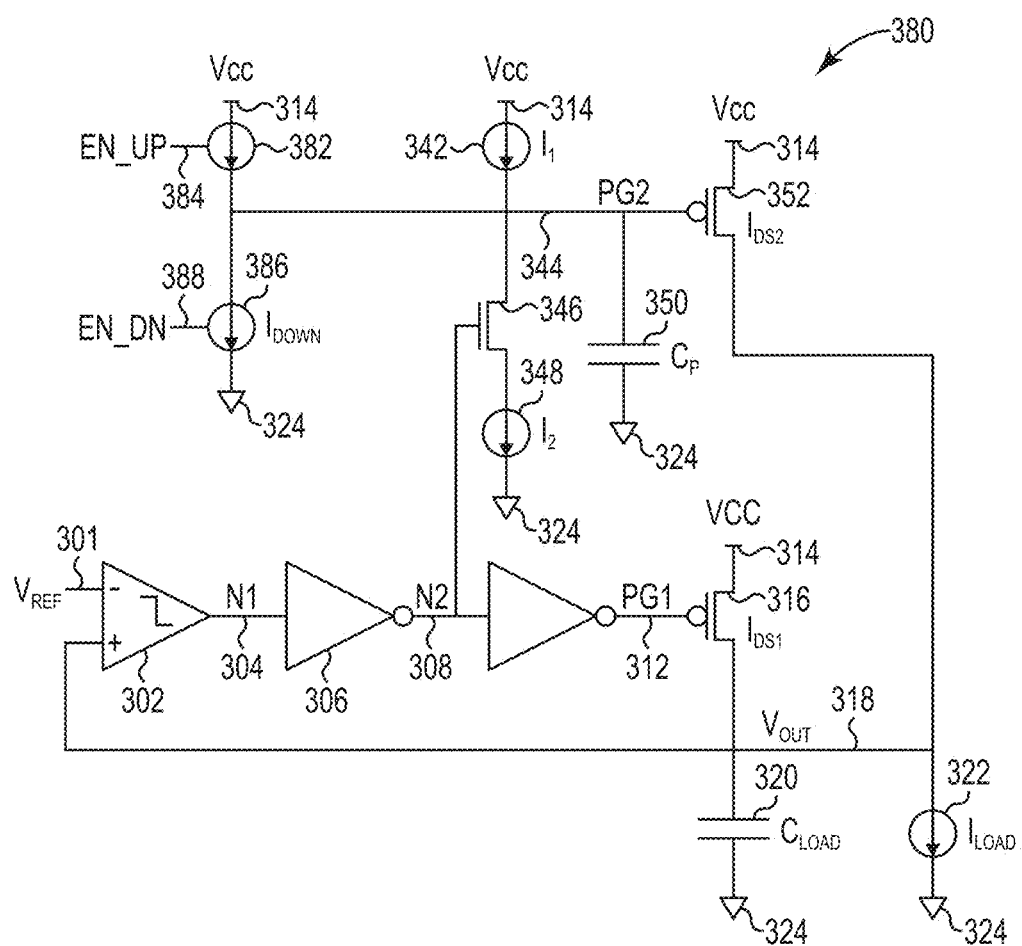
FIG. 5 is a schematic diagram illustrating another embodiment of an analog assisted digital switch regulator.

FIG. 5 is a schematic diagram illustrating another embodiment of an analog assisted digital switch regulator 380. Analog assisted digital switch regulator 380 is similar to analog assisted digital switch regulator 340 previously described and illustrated with reference to FIG. 4, except that analog assisted digital switch regulator 380 includes a slew rate adjustment circuit. The slew rate adjustment circuit includes a first controllable current source 382 and a second controllable current source 386. First controllable current source 382 is electrically coupled between the supply voltage 314 and PG2 signal path 344. The various nodes of supply voltage 314 may supply the same voltage or different voltages. First controllable current source 382 receives an enable up (EN_UP) signal on signal path 384 for controlling first controllable current source 382. Second controllable current source 386 is electrically coupled between PG2 signal path 344 and common or ground 324. Second controllable current source 386 receives an enable down (EN_DN) signal on signal path 388 for controlling second controllable current source 386. In one example, the EN_UP and EN_DN signals are provided from a processor, such as processor 130 (FIG. 1A), by control logic, such as control logic 116 (FIG. 1A), or by another suitable source.

The EN_UP signal is used to adjust the slew rate by enabling controllable current source 382 to assist first current source 342 in charging capacitor 350. Controllable current source 382 may be used to adjust a first speed at which capacitor 350 is charged. Accordingly, the time needed to charge capacitor 350 may be adjusted (e.g., decreased). The EN_DN signal is used to adjust the slew rate by enabling controllable current source 386 to assist second current source 348 in discharging capacitor 350. Controllable current source 386 may be used to adjust a second speed at which capacitor 350 is discharged. Accordingly, the time needed to discharge capacitor 350 may be adjusted (e.g., decreased).

Figure 6:
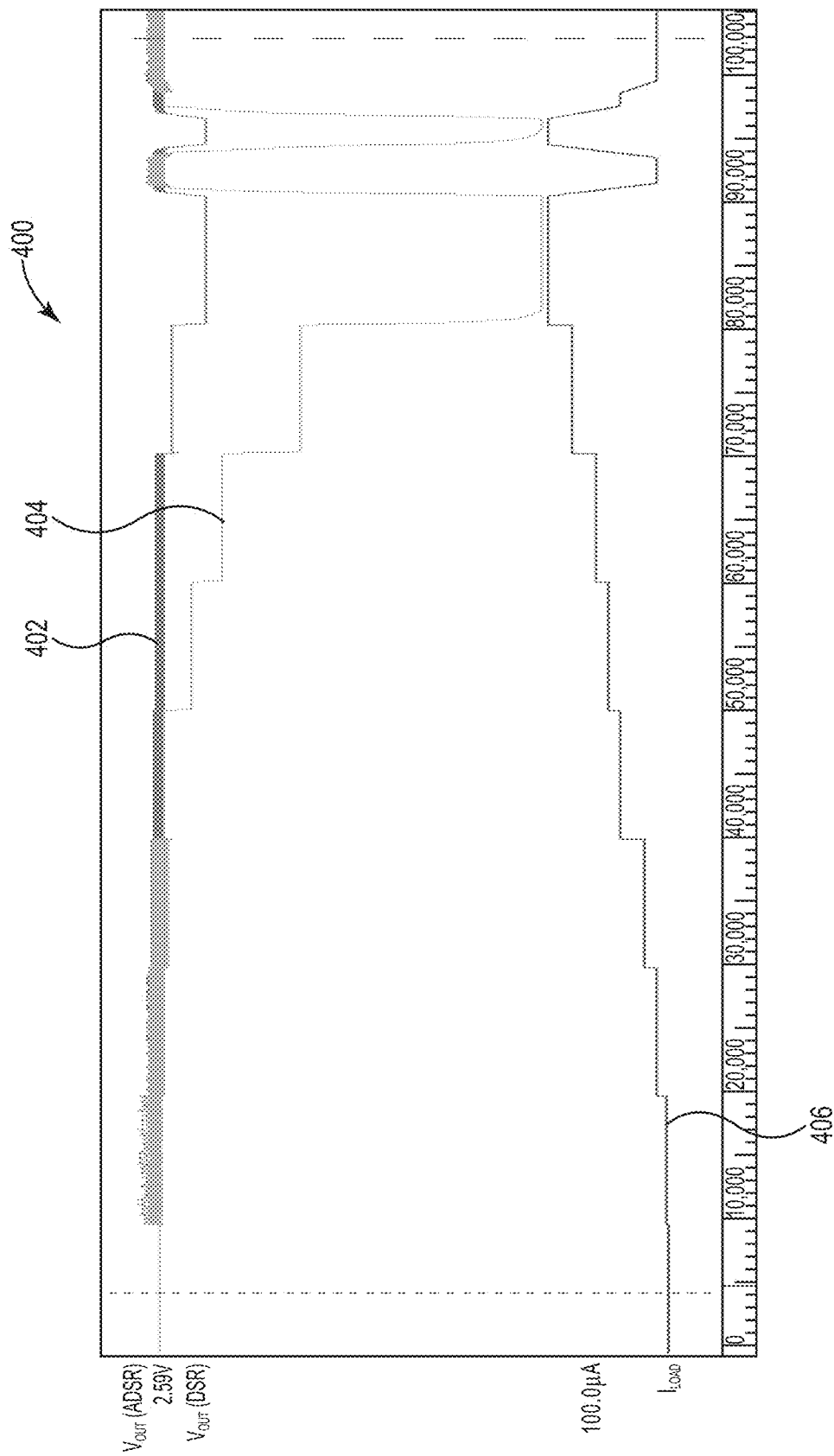
FIG. 6 is a chart illustrating one example simulation of a comparison between a digital switch regulator and an analog assisted digital switch regulator for a variable load current.

FIG. 6 is a chart 400 illustrating one example simulation of a comparison between a digital switch regulator (e.g., 300 in FIG. 3) and an analog assisted digital switch regulator (e.g., 340 in FIG. 4) for a variable load current $I_{LOAD}$. In this example, the load current indicated at 406 is varied between 100 µA and 50 mA. The output voltage $V_{OUT}$ (ADSR) for an analog assisted digital switch regulator is indicated at 402. The output voltage $V_{OUT}$ (DSR) for a digital switch regulator is indicated at 404. As illustrated in chart 400, as the load current increases, the analog assisted digital switch regulator has an improved response compared to the digital switch regulator as indicated by the smaller voltage swings of the analog assisted digital switch regulator.

Figure 7:
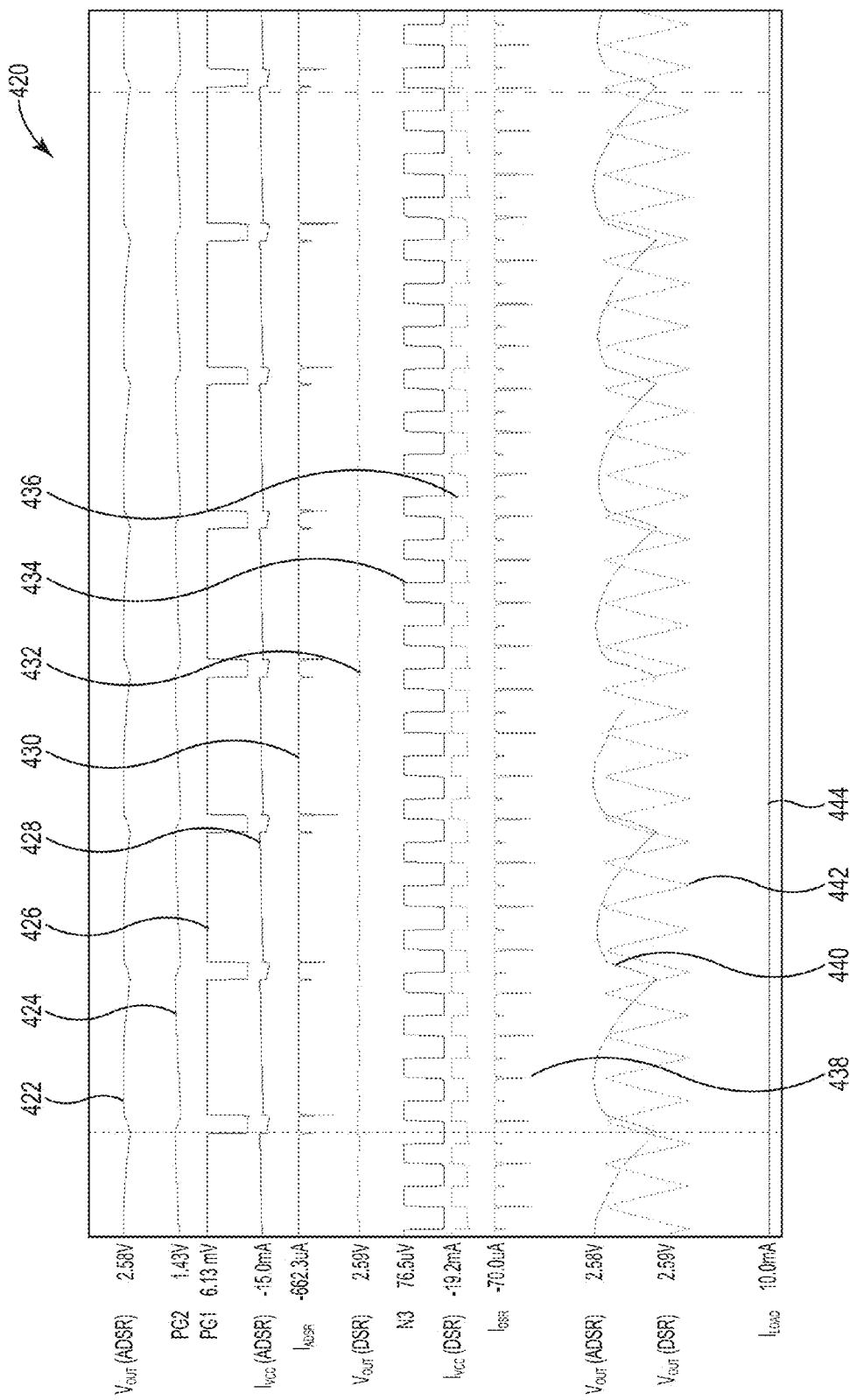
FIG. 7 is a chart illustrating one example simulation of a comparison between a digital switch regulator and an analog assisted digital switch regulator for a 10 mA load current.

FIG. 7 is a chart 420 illustrating one example simulation of a comparison between a digital switch regulator and an analog assisted digital switch regulator for a 10 mA load current. Chart 420 includes example signals for digital switch regulator 300 and analog assisted digital switch regulator 340 previously described and illustrated with reference to FIGS. 3 and 4, respectively. The analog assisted digital switch regulator signals include the $V_{OUT}$ (ADSR) signal 422 on signal path 318, the PG2 signal 424 on signal path 344, the PG1 signal 426 on signal path 312, the $I_{VCC}$ (ADSR) signal 428 indicating the current supplied to the load (i.e., $I_{DS1}$ plus $I_{DS2}$), and the $I_{ADSR}$ signal 430 indicating the current consumed by the analog assisted digital switch regulator 340.

The digital switch regulator signals include the $V_{OUT}$ (DSR) signal 432 on signal path 318, the N3 signal 434 on signal path 312, the $I_{VCC}$ (DSR) signal 436 indicating the current supplied to the load (i.e., $I_{DS}$), and the $I_{DSR}$ signal 438 indicating the current consumed by the digital switch regulator 300. Chart 420 also includes the $V_{OUT}$ (ADSR) signal 440 for the analog assisted digital switch regulator superimposed over the $V_{OUT}$ (DSR) signal 442 for the digital switch regulator. Finally, chart 420 includes the $I_{LOAD}$ signal 444.

As illustrated by chart 420, the digital switch regulator switches about four times faster than the analog assisted digital switch regulator to supply the 10 mA load current, thereby consuming more power. In this example, the average value of the $I_{ADSR}$ signal 430 is 126 µA and the average value of the $I_{DSR}$ signal 438 is 350 µA. Accordingly, in this example, the analog assisted digital switch regulator provides a 64% switching power reduction compared to the digital switch regulator.

Figure 8:
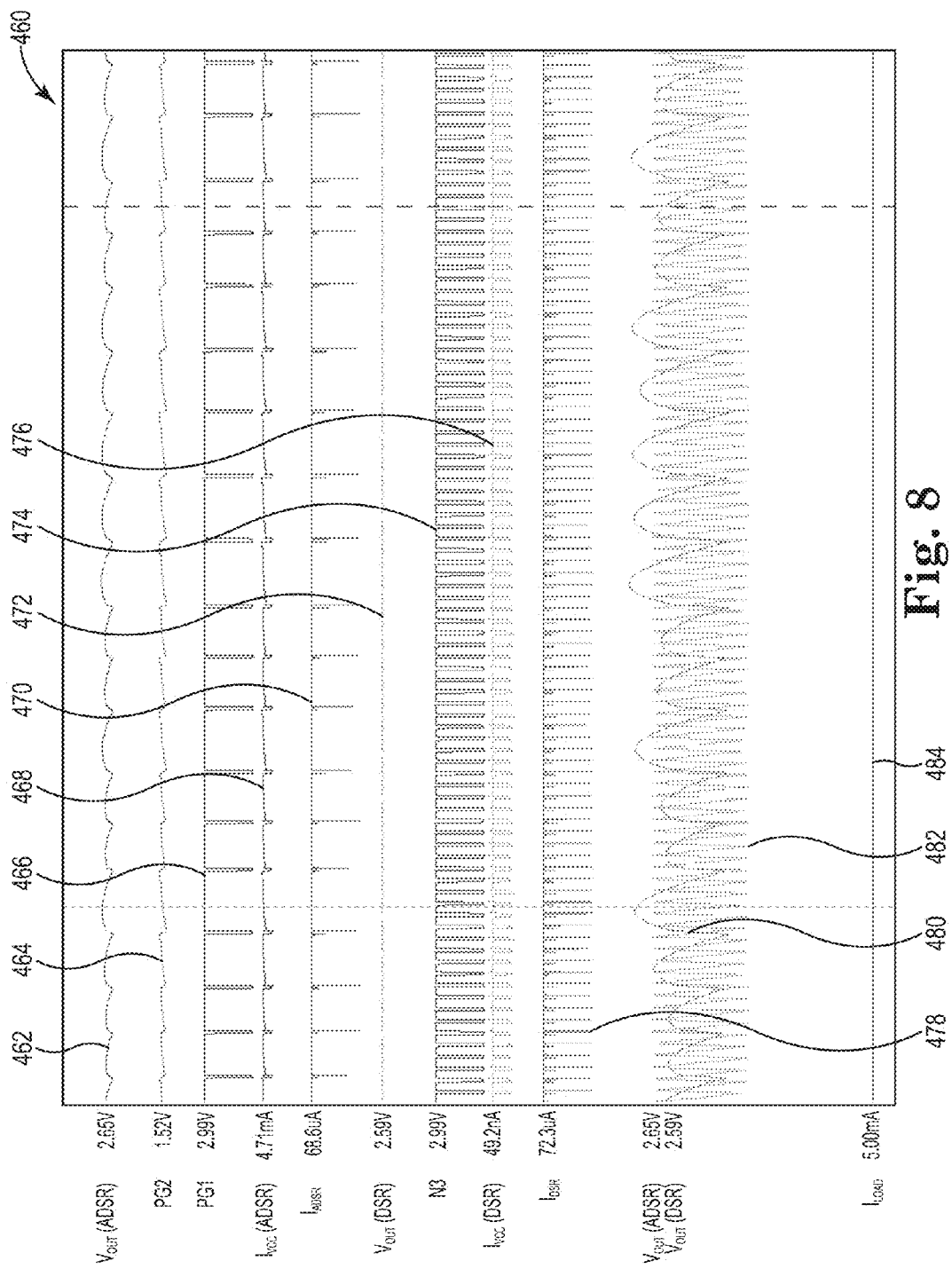
FIG. 8 is a chart illustrating one example simulation of a comparison between a digital switch regulator and an analog assisted digital switch regulator for a 5 mA load current.

FIG. 8 is a chart 460 illustrating one example simulation of a comparison between a digital switch regulator and an analog assisted digital switch regulator for a 5 mA load current. Chart 460 includes example signals for digital switch regulator 300 and analog assisted digital switch regulator 340 previously described and illustrated with reference to FIGS. 3 and 4, respectively. The analog assisted digital switch regulator signals include the $V_{OUT}$ (ADSR) signal 462 on signal path 318, the PG2 signal 464 on signal path 344, the PG1 signal 466 on signal path 312, the $I_{VCC}$ (ADSR) signal 468 indicating the current supplied to the load (i.e., $I_{DS1}$ plus $I_{DS2}$), and the $I_{ADSR}$ signal 470 indicating the current consumed by the analog assisted digital switch regulator 340.

The digital switch regulator signals include the $V_{OUT}$ (DSR) signal 472 on signal path 318, the N3 signal 474 on signal path 312, the $I_{VCC}$ (DSR) signal 476 indicating the current supplied to the load (i.e., $I_{DS}$), and the $I_{DSR}$ signal 478 indicating the current consumed by the digital switch regulator 300. Chart 460 also includes the $V_{OUT}$ (ADSR) signal 480 for the analog assisted digital switch regulator superimposed over the $V_{OUT}$ (DSR) signal 482 for the digital switch regulator. Finally, chart 460 includes the $I_{LOAD}$ signal 484.

As illustrated by chart 460, the digital switch regulator switches about five times faster than the analog assisted digital switch regulator to supply the 5 mA load current, thereby consuming more power. In this example, the average value of the $I_{ADSR}$ signal 470 is 101 µA and the average value of the $I_{DSR}$ signal 478 is 302 µA. Accordingly, in this example, the analog assisted digital switch regulator provides a 67% switching power reduction compared to the digital switch regulator.

Figure 9:
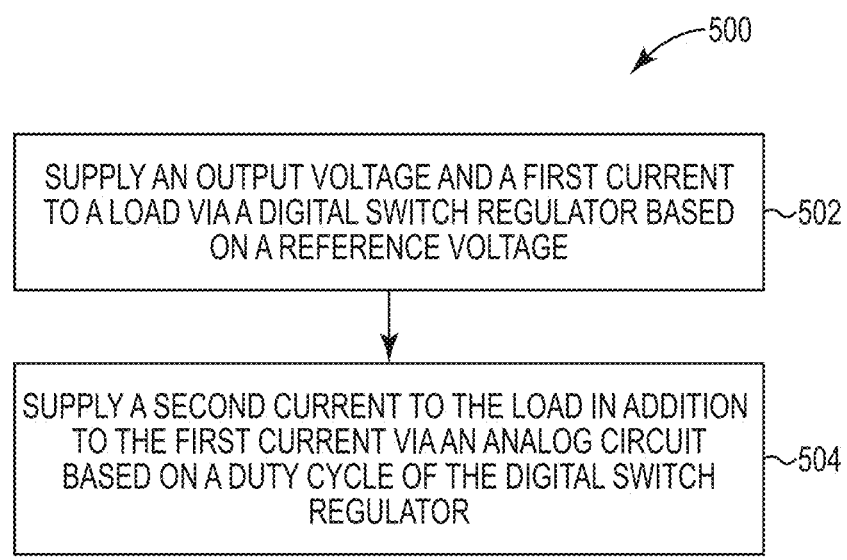
FIG. 9 is a flow diagram illustrating one embodiment of a method for analog assisted digital switch regulation.

FIG. 9 is a flow diagram illustrating one embodiment of a method 500 for analog assisted digital switch regulation. At 502, an output voltage and a first current are supplied to a load via a digital switch regulator based on a reference voltage. At 504, a second current is supplied to the load in addition to the first current via an analog circuit based on a duty cycle of the digital switch regulator. The supply of the output voltage and the first current may include turning on a first transistor to supply the first current in response to the output voltage being less than the reference voltage and turning off the first transistor in response to the output voltage being greater than the reference voltage. The supply of the second current may include turning on a second transistor to supply the second current in response to the output voltage being less than the reference voltage and turning off the second transistor in response to the output voltage being greater than the reference voltage. The slew rate of the supplying of the second current may also be adjusted.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:
1. A device comprising:
a digital switch regulator to supply an output voltage and a first current to a load based on a reference voltage; and
an analog circuit to supply a second current to the load in addition to the first current based on a duty cycle of the digital switch regulator,
wherein the analog circuit comprises a capacitor electrically coupled between a gate of a first transistor and ground, the first transistor to supply the second current, and
wherein the analog circuit further comprises a first current source, a second current source, and a second transistor having a source-drain path directly electrically coupled between the first current source and the second current source and a gate electrically coupled to only the digital switch regulator, the second transistor turned off in response to the output voltage being greater than the reference voltage such that the first current source charges the capacitor, and the second transistor turned on in response to the output voltage being less than the reference voltage such that the second current source discharges the capacitor.

2. The device of claim 1, wherein the analog circuit supplies the second current to the load in addition to the first current in response to the output voltage being less than the reference voltage.

3. The device of claim 1, wherein a bandwidth of the analog circuit is at least one decade lower than a bandwidth of the digital switch regulator.

4. The device of claim 1, wherein the digital switch regulator comprises a comparator and a transistor electrically coupled to the comparator, the comparator to turn on the transistor to supply the first current in response to the output voltage being less than the reference voltage and to turn off the transistor in response to the output voltage being greater than the reference voltage.

5. The device of claim 4, wherein the digital switch regulator further comprises a buffer between the comparator and the transistor.

6. The device of claim 1, wherein the first transistor is turned on in response to the capacitor being discharged and turned off in response to the capacitor being charged.

7. The device of claim 6, wherein the analog circuit further comprises a slew rate adjustment circuit to adjust a first speed at which the capacitor is charged and a second speed at which the capacitor is discharged.

8. The device of claim 1, wherein the second current source is greater than the first current source.

9. The device of claim 1, wherein the analog circuit further comprises a third current source and a fourth current source, the third current source turned on to increase the speed at which the capacitor is charged, and the fourth current source turned on to increase the speed at which the capacitor is discharged.

10. A system comprising:
a variable load; and
a switch regulator to supply an output voltage and an output current to the load, the switch regulator comprising a digital portion and an analog portion, the digital portion to regulate the output voltage and supply a first portion of the output current to the load based on a reference voltage and the analog portion to supply a second portion of the output current to the load based on a switching frequency of the digital portion,
wherein the analog portion comprises a capacitor electrically coupled between a gate of a first transistor and ground, the first transistor to supply the second portion of the output current, and wherein the analog circuit further comprises a first current source, a second current source, and a second transistor having a source-drain path directly electrically coupled between the first current source and the second current source and a gate electrically coupled to only the digital portion, the second transistor turned off in response to the output voltage being greater than the reference voltage such that the first current source charges the capacitor, and the second transistor turned on in response to the output voltage being less than the reference voltage such that the second current source discharges the capacitor.

11. The system of claim 10, wherein the analog portion supplies the second portion of the output current to the load in response to the output voltage being less than the reference voltage.

12. The system of claim 10, wherein a bandwidth of the digital portion is at least one decade greater than a bandwidth of the analog portion.

13. The system of claim 10, wherein the first transistor is turned on in response to the capacitor being discharged and turned off in response to the capacitor being charged.

14. The system of claim 10, wherein the analog portion comprises a slew rate adjustment circuit to adjust a slew rate of the analog portion.

15. The system of claim 10, wherein the second current source is greater than the first current source.

16. A method comprising:
supplying an output voltage and a first current to a load via a digital switch regulator based on a reference voltage; and
supplying a second current to the load in addition to the first current via an analog circuit based on a duty cycle of the digital switch regulator,
wherein the analog circuit comprises a capacitor electrically coupled between a gate of a first transistor and ground, the first transistor to supply the second current,
wherein the analog circuit further comprises a first current source, a second current source, and a second transistor having a source-drain path directly electrically coupled between the first current source and the second current source and a gate electrically coupled to only the digital switch regulator, and
wherein supplying the second current comprises:
turning on the second transistor such that the second current source discharges the capacitor to turn on the first transistor to supply the second current in response to the output voltage being less than the reference voltage; and
turning off the second transistor such that the first current source charges the capacitor to turn off the first transistor in response to the output voltage being greater than the reference voltage.

17. The method of claim 16, wherein supplying the output voltage and the first current comprises:
turning on a third transistor to supply the first current in response to the output voltage being less than the reference voltage; and
turning off the third transistor in response to the output voltage being greater than the reference voltage.

18. The method of claim 16, further comprising:
adjusting a slew rate of the supplying of the second current.

19. The method of claim 16, wherein the second current source is greater than the first current source.

* * * * *